United States Patent [19]

Kodama et al.

[11] Patent Number: 4,525,808
[45] Date of Patent: Jun. 25, 1985

[54] HYBRID MAGNETIC BUBBLE MEMORY DEVICE

[75] Inventors: Naoki Kodama, Hachioji; Ryo Suzuki, Kodaira; Teruaki Takeuchi, Kokubunji; Masatoshi Takeshita, Hachioji; Yutaka Sugita, Tokorozawa, all of Japan

[73] Assignee: Hitachi, Ltd., Tokyo, Japan

[21] Appl. No.: 592,954

[22] Filed: Mar. 23, 1984

[30] Foreign Application Priority Data

Mar. 25, 1983 [JP] Japan .................................. 58-48958

[51] Int. Cl.³ ............................................. G11C 19/08
[52] U.S. Cl. ....................................................... 365/36
[58] Field of Search ............................................ 365/36

[56] References Cited

U.S. PATENT DOCUMENTS 4,357,683 11/1982 Nelson ................................... 365/36
4,453,231 6/1984 Kodama et al. ....................... 365/36

Primary Examiner—James W. Moffitt
Attorney, Agent, or Firm—Antonelli, Terry & Wands

[57] ABSTRACT

A hybrid magnetic bubble memory device includes a first magnetic bubble propagation tracks formed of a portion of the boundary between first and second regions of a magnetic medium film having uniaxial anisotropy and adapted to be applied with a magnetic field in a direction perpendicular to the magnetic medium film to generate magnetic bubbles therein, and a second magnetic bubble propagation tracks formed of a soft magnetic material film on the magnetic medium film and connected with the first magnetic bubble propagation tracks. The first region is implanted with ions under ion-implant conditions different from those for the second region, and thus the above boundary is produced. The boundary between the first region and the second region is bent at junctions for transferring a magnetic bubble from the second magnetic bubble propagation tracks to the first magnetic bubble propagation tracks, to divide the boundary into a boundary portion for propagating a magnetic bubble and another boundary portion having no connection with magnetic bubble propagation, and an angle between the boundary portions at the bend in the boundary is in a range from 45 to 180 degrees.

2 Claims, 8 Drawing Figures

HYBRID MAGNETIC BUBBLE MEMORY DEVICE

BACKGROUND OF THE INVENTION

The present invention relates to a hybrid magnetic bubble memory device in which magnetic bubble propagation tracks formed of an ion-implanted layer and magnetic bubble propagation tracks formed of a soft magnetic material film (for example, a nickel-iron alloy film such as a Permalloy film) are both provided on a single chip including a magnetic medium for supporting a magnetic bubble, and more particularly to the junctions of the two magnetic bubble propagation tracks.

Magnetic bubble propagation tracks formed of a Permalloy film (namely, Permalloy tracks) have hitherto been used in magnetic bubble memory devices. However, when these Permalloy tracks have a period of less than 4 μm to be used in a high density device, the propagation margin of the tracks is too small for practical use. Meanwhile, it has been known that even when magnetic bubble propagation tracks formed by ion implantation have a period of less than 4 μm, the propagation tracks can propagate magentic bubbles and moreover the propagation margin of these tracks is of practical values.

The magnetic bubble propagation tracks based upon ion implantation (namely, ion-implanted tracks) are formed in the following manner. As shown in FIG. 1, a contiguous-disc pattern 2 is first formed of a metal or photoresist film, on a magnetic bubble supporting layer 1 which is provided on a non-magnetic garnet substrate and made of magnetic garnet. Then, ions 3 such as Ne+ and H$_2$+ are implanted in the surface of the bubble supporting layer 1 while using the pattern 2 as a mark. Thus, a layer of magnetization aligned in plane is formed of an ion-implanted layer 4, in a surface portion of the bubble supporting layer 1 on the outside of the pattern 2. A magnetic bubble 6 is propagated along the periphery of the pattern 2, namely, the boundary 5 of the ion-implanted layer 4. In the case where the bubble propagation tracks are formed in the above-mentioned manner, in order to suppress the generation of hard magnetic bubbles, an ion-implanted layer is previously formed in the whole surface of the bubble supporting layer 1 so that the depth of this ion-implanted layer is smaller than that of the ion-implanted layer 4 for forming the bubble propagation tracks.

The pattern 2 for determining the ion-implanted tracks 5 can be readily formed, since the pattern 2 is continuous, that is, has no gap between discs. Further, the ion-implanted tracks 5 have an advantage that a driving magnetic field for propagating a magnetic bubble can be made small. However, the ion-implanted tracks 5 have a drawback that when function parts necessary for a magnetic bubble memory device such as transfer gates and replicate gates are formed in the ion-implanted tracks 5, these function parts are small in operation margin or do not operate at all. Accordingly, the ion-implanted tracks 5 are not yet put into practical use. On the contrary, the above-mentioned function parts in the Permalloy tracks can perform a stable operation for practical use, and have a wide operation margin.

In view of the above facts, a hybrid magnetic bubble memory device has been developed in which the ion-implanted tracks are used in a memory part which is required to have a high density, and the Permalloy tracks are used in function parts (refer to a Japanese Patent Application Laid-Open No. 40791/1982, laid-open on Mar. 6, 1982, the application filed in the name of Fujitsu, Ltd.).

In the hybrid magnetic bubble memory device, it is desirable to avoid implanting ions in that portion of the bubble supporting layer which exists beneath the Permalloy tracks, to such a depth as required in forming the ion-implanted tracks. That is, when a layer of magnetization aligned in plane is formed below the Permalloy propagation tracks by ion implantation, the action of a magnetic pole which is produced in the Permalloy propagation tracks, on a magnetic bubble is weakened by the layer of magnetization aligned in plane, and thus the propagation margin is decreased. Accordingly, in ordinary cases, a thin ion-implanted layer is previously formed in the whole surface of the bubble supporting layer to suppress the generation of hard magnetic bubbles.

In the hybrid magnetic bubble memory device, it is important to appropriately determine the structure of the junction of the ion-implanted tracks and Permalloy tracks, in order to transfer a magnetic bubble between these propagation tracks smoothly.

In the above-mentioned Japanese Patent Application Laid-Open publication it is described that magnetic bubbles can be smoothly transferred between the ion-implanted tracks and the Permalloy tracks by overlapping two kinds of propagation tracks at their junction. However, the above Laid-Open publication does not disclose any detailed structure of the junction. The present inventors' experimental results have shown that a favorable propagation margin is not obtained only by overlapping two kinds of propagation tracks at the junction, but special attention has to be paid to the shape of the junction to obtain the favorable propagation margin.

SUMMARY OF THE INVENTION

An object of the present invention is to provide a hybrid magnetic bubble memory device which includes magnetic bubble propagation tracks (namely, first propagation track means) formed of the boundary of such a region of a magnetic bubble supporting layer as implanted with ions under a condition different from the ion-implant condition of the remaining region of the magnetic bubble supporting layer, and other magnetic bubble propagation tracks (namely, second propagation track means) formed of a soft magnetic material film, and in which the structure of the junction of the first and second propagation tracks is appropriately selected to improve the propagation margin at the junction.

In order to attain the above object, according to the present invention, there is provided a hybrid magnetic bubble memory device including first and second magnetic bubble propagation track means in such a manner that the first magnetic bubble propagation track means is formed of a portion of the boundary between a predetermined and the remaining regions of a magnetic medium film having uniaxial anisotropy and adapted to be applied with a magnetic field in a direction perpendicular to the magnetic medium film to generate magnetic bubbles therein, the boundary is produced by implanting the predetermined region with ions under a condition different from the ion-implant condition of the remaining region, and said second magnetic bubble propagation track means is formed of a soft magnetic material film on the magnetic medium film and connected with the first magnetic bubble propagation track, wherein the boundary between the predetermined region and the remaining region is bent at a junction for transferring magnetic bubbles from the second magnetic bubble propagation tracks to the first magnetic bubble propagation tracks, to divide the boundary into a boundary portion for propagation of magnetic bubbles and another boundary portion foreign to magnetic bubble propagation, and an angle between the two boundary portions at the bend in the boundary is in a range from 45 to 180 degrees, preferably in a range from 90 to 180 degrees.

DESCRIPTION OF THE PREFERRED EMBODIMENT

Figure 1:
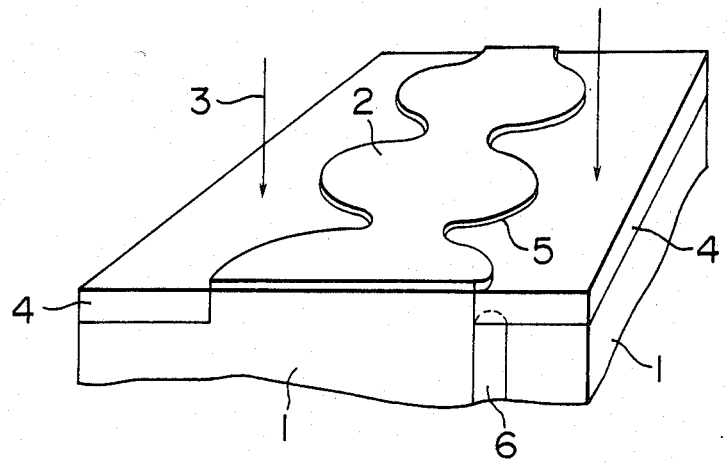
FIG. 1 is a schematic view for explaining how ion-implanted tracks are formed.
Figure 2:
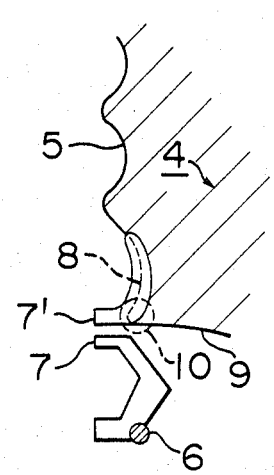
FIG. 2 is a schematic view showing a junction of the ion-implanted track and the Permalloy track which are provided in a hybrid magnetic bubble memory device.

FIG. 2 shows an example of a junction provided in a magnetic bubble memory device for connecting magnetic bubble propagation tracks 7 (constituting second propagation track means) formed of a Permalloy film with magnetic bubble propagation tracks 5 (constituting first propagation track means) formed of the boundary between an ion-implanted region 4 (namely, the layer of magnetization aligned in plane) and the remaining region.

A magnetic bubble 6 is transferred from the second propagation (Permalloy) track 7 to the first propagation (ion-implanted) track 5 formed by ion implantation. In such a case, the boundary between the ion-implanted region 4 and the remaining region is bent at the junction of the propagation tracks 5 and 7, that is, a bend 10 is formed in the boundary, to divide the boundary into a boundary portion 8 for propagating magnetic bubbles and another boundary portion 9 having no connection with magnetic bubble propagation. The magnetic bubble 6 is transferred from the second propagation track 7 (namely, the Permalloy propagation track) to the boundary portion 8 at the bend 10. Further, in order to facilitate the transfer of the magnetic bubble 6 at the junction, a Permalloy film 7' at the junction is provided so that the boundary portion 8 for propagating a magnetic bubble and the permalloy film 7' overlap.

Various bubble transfer patterns as shown in FIG. 2 have been formed in such a manner that the shape of the bend 10 formed at the junction of the first and second propagation tracks 5 and 7 is varied, and experiments on magnetic bubble transfer have been done for the above bubble transfer patterns. The experimental results show that the propagation margin at the junction is dependent greatly upon the angle between the boundary portions 8 and 9 at the bend 10.

This is because the in-plane magnetization of the ion-implanted layer 4 produces a magnetic pole in the boundary of the ion-implanted layer 4 when a rotating magnetic field for driving a magnetic bubble is applied to the layer 4. In more detail, when a magnetic pole attracting a magnetic bubble is produced not in the boundary portion 8 for propagating a magnetic bubble but in the boundary portion 9, the magnetic bubble is attracted to the magnetic pole in the boundary portion 9, and thus desired bubble transfer cannot be performed. Further, when a bias magnetic field is made small, the magnetic bubble is readily stretched, and specifically the magnetic bubble is stretched along the boundary portion 9 by the magnetic pole produced in the boundary portion 9. Thus, the propagation margin is deteriorated.

In order to prevent the above phenomena from occurring, it is required to keep the boundary portion 9 having no connection with magnetic bubble propagation, away from the boundary portion 8 for propagating a magnetic bubble, that is, to make large an angle between the boundary portions 8 and 9 at the bend 10.

Now, the present invention will be explained below, on the basis of an embodiment thereof.

Figure 3:
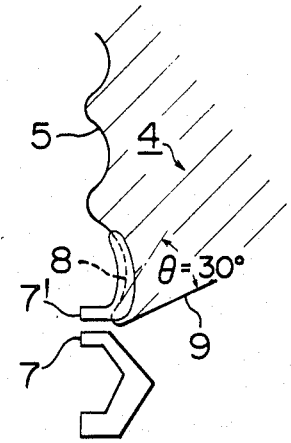
FIGS. 3 to 5 are schematic views showing examples of a junction of the ion-implanted track and the Permalloy track, in which the boundary of an ion-implanted region is bent at the junction so that an angle between two boundary portions at the bend is equal to 30, 90 or 160 degrees.
Figure 4:
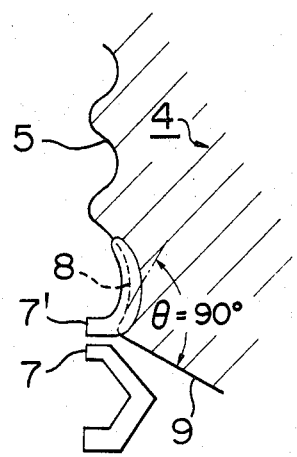
Figure 5:
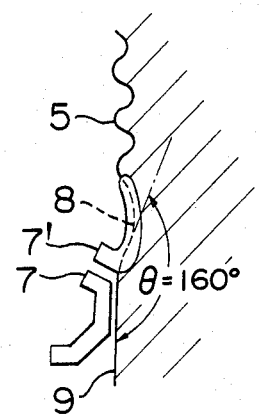
Figure 6:
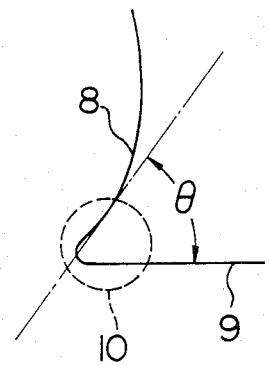
FIG. 6 is a schematic view for explaining the definition of the angle.
Figure 7:
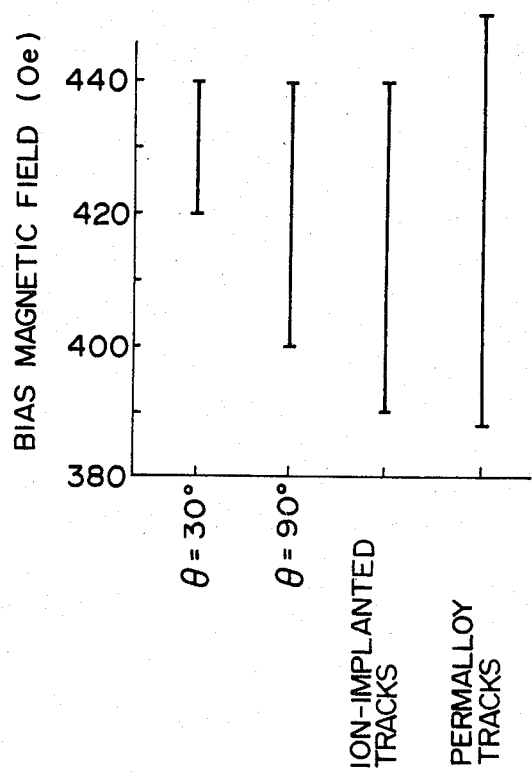
FIG. 7 is a graph showing the propagation margin at a junction for the case where an angle between two boundary portions at the bend in the boundary is equal to 30 or 90 degrees, the propagation margin at the ion-implanted tracks, and the propagation margin at the Permalloy tracks.

Various samples were made in such a manner that Ne+ ions were previously implanted in the whole surface of a bubble supporting layer at an implant energy of 50 keV and at an ion dosage of $1 \times 10^{14}$ ion/cm$^2$ to suppress the generation of hard magnetic bubbles, and thereafter H$_2$+ ions were twice implanted in the bubble supporting layer first at an implant energy of 35 keV and at an ion dosage of $1 \times 10^{16}$ ion/cm$^2$ and then at an implant energy of 80 keV and at an ion dosage of $4.5 \times 10^{16}$ ion/cm$^2$, to form ion-implanted tracks 5. Those ones of the above samples in which an angle between the boundary portions 8 and 9 at the junction of the Permalloy tracks 7 and ion-implanted tracks 5 were made equal to 30, 90 and 160 degrees, are shown in FIGS. 3, 4 and 5, respectively. $\theta$ is defined as the angle between the boundary 9 and the tangent line of the boundary 8 through the bottom of the bend 10 as shown in FIG. 6. FIG. 7 shows the propagation margin at the junction of each of the samples shown in FIGS. 3 and 4, the propagation margin of the ion-implanted tracks 5, and the propagation margin of the Permalloy tracks 7. As shown in FIG. 7, the lower limit of the propagation margin of the junction of the sample in which the angle between the boundary portions 8 and 9 is equal to 30 degrees, is far higher than the lower limit of the propagation margin of the ion-implanted tracks 5. That is, the propagation margin of the junction is deteriorated, as compared with the propagation margin of the ion-implanted tracks.

Figure 8:
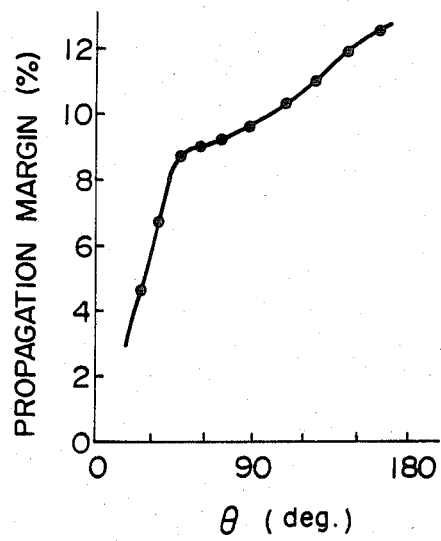
FIG. 8 is a graph showing the variation of the propagation margin at a junction with the angle between two boundary portions at the bend in the boundary.

FIG. 8 shows the propagation margin measured at the junction of each of the samples in which the angle between the boundary portions 8 and 9 at the bend 10 takes various values as shown in FIGS. 3 to 5. As can been seen from FIG. 8, it is possible to prevent the propagation margin of the junction from deteriorating, by determining the angle between the boundary portions 8 and 9 at the bend 10 to be in a range from 45 to 180 degrees. When it is assumed that a practical propagation margin is more than 10%, it is desirable to determine the above angle so as to be in a range from 90 to 180 degrees. Incidentally, the upper limit of the range, that is, an angle of 180° is given for the geometical reason that when the angle between the boundary portions 8 and 9 exceeds 180°, the boundary cannot be bent to the desired side.

As has been explained in the foregoing, according to the present invention, the propagation margin of the junction between the ion-implanted tracks and the Permalloy tracks which are both formed in a hybrid magnetic bubble memory device, can be made no less than 10% which is a practical value.

We claim:

1. A hybrid magnetic bubble memory device including first and second magnetic bubble propagation track means in such a manner that said first magnetic bubble propagation track means is formed of a portion of the boundary between first and second regions of a magnetic medium film having uniaxial anisotropy and adapted to be applied with a magnetic field in a direction perpendicular to said magnetic medium film to generate a magnetic bubble therein, said boundary is produced by implanting said first region with ions under ion-implant conditions different form those for said second region, and said second magnetic bubble propagation track means is formed of a soft magnetic material film on said magnetic medium film and connected with said first magnetic bubble propagation track, wherein said boundary between said first region and said second region is bent at a junction for transferring a magnetic bubble from said second magnetic bubble propagation track means to said first magnetic bubble propagation track means, to divide said boundary into a boundary portion for propagating a magnetic bubble and another boundary portion foreign to magnetic bubble propagation, and an angle between said two boundary portions at the bend in said boundary is put in a range from 45 to 180 degrees.

2. A hybrid magnetic bubble memory device according to claim 1, wherein an angle between said boundary portion for propagating said magnetic bubble and said boundary portion foreign to magnetic bubble propagation, at said bend in said boundary is in a range from 90 to 180 degrees.

* * * * *